US005530410A

United States Patent [19]

Chu

[11] Patent Number: 5,530,410

[45] **Date of Patent: *Jun. 25, 1996**

[54] ACOUSTIC FREQUENCY MIXING DEVICES USING POTASSIUM TITANYL PHOSPHATE AND ITS ANALOGS

[75] Inventor: David K.-T. Chu, Wilmington, Del.

[73] Assignee: E. I. Du Pont de Nemours and Company, Wilmington, Del.

[ * ] Notice: The term of this patent shall not extend beyond the expiration date of Pat. No. 5,350,961.

[21] Appl. No.: 343,071

[22] Filed: Nov. 21, 1994

Related U.S. Application Data

[63] Continuation of Ser. No. 134,135, Oct. 8, 1993.

[51] Int. Cl.$^{6}$ ...... H03H 9/00

[52] U.S. Cl. ...... 333/153; 333/132; 310/313 A; 364/821

[58] Field of Search ...... 333/150–153, 333/132; 310/313 R, 313 A, 313 B; 364/821

[56] References Cited

U.S. PATENT DOCUMENTS

| | | | |
|---|---|---|---|
| 3,675,163 | 7/1972 | Hartmann et al. | 333/30 |
| 3,851,280 | 11/1974 | Staples | 333/30 |
| 4,016,412 | 4/1977 | Stern et al. | 235/181 |
| 4,231,838 | 11/1980 | Gier | 156/600 |
| 4,428,062 | 1/1984 | Michaels | 364/821 |
| 4,766,954 | 8/1988 | Bierlein et al. | 156/624 |
| 5,066,356 | 11/1991 | Ferretti et al. | 156/623 |
| 5,350,961 | 9/1994 | Chu | 310/313 A |

OTHER PUBLICATIONS

White R. M. et al., *Appl. Phys. Lett.*, 7(12), 314–316, Dec. 15, 1965.

Kuhn, L. et al., *Appl. Phys. Lett.*, 17(6), 265–267, Sep. 14, 1970.

Buritskii, K. S. et al., *Sov. Tech. Phys. Lett.*, 17(8), 563–565, 1991.

Wagers, R. S. et al., *IEEE Transactions on Sonics and Ultrasonics*, SU–31(3), 168–174, May 1984.

Bleustein, J. L. et al., *Appl. Phys. Lett.*, 13(12), 412–413, Dec. 5, 1968.

Tseng, C. C., *Appl. Phys. Lett.*, 16(6), 253–255, Mar. 15, 1970.

Lewis, M., et al, *1977 Ultrasonics Symposium Proceedings IEEE Cat. # 77CH1264–ISU*, 744–752.

Buritskii, K. S., et al, *Electronics Letters*, 27(21), 1896–1897, Oct. 10, 1991.

Fischer, J. H., et al, *IEEE Proceedings*, 75(1), 100–115, Jan. 1987.

Campbell, C. *Surface Acoustic Wave Devices and Their Signal Processing Applications*, Academic Press. Inc. San Diego, CA, 329–356, 1989.

Martin, S. J., et al. *Transducers '87 Rec. of the 4th Int. Conf. on Solid–State Sensors and Actuators*, 478–481, 1987 (reprint).

Defranould, P., et al, *Proceedings of the IEEE*, 64(5), pp. 748–751, May 1974.

(List continued on next page.)

*Primary Examiner*—Robert Pascal
*Assistant Examiner*—Darius Gambino

[57] ABSTRACT

Acoustic frequency mixing devices for controlling high frequency signals by the generation of acoustic waves are disclosed. The devices include (a) a crystalline substrate of $MTiOXO_4$ (wherein M is K, Rb, Tl and/or $NH_4$ and X is P and/or As) having a surface with at least two input areas; and (b) an input interdigital transducer deposited on each of at least two signal input areas of said substrate surface, each IDT suitable for connection to a source of electric signal and for inverse piezoelectrically generating acoustic waves (e.g., SAWs or B-G waves) in the substrate. For controlling high frequency electrical signals, the substrate surface has a output area and the device typically includes an output electrode (e.g., an interdigital transducer) deposited on the signal output area of said substrate surface suitable for piezoelectrically detecting acoustic waves obtained by mixing the frequencies of waves generated by at least two input interdigital transducers, and for connecting the output electrode to an electric signal responsive device.

10 Claims, 3 Drawing Sheets

OTHER PUBLICATIONS

Oliner, A. A. (Ed.), *Acoustic Surface Waves,* Springer–Verlag, Chapter 5, pp. 187–192, 1978.

Baer, R. L., et al., *IEEE Ultrasonic Symposium,* 293–298, 1992.

Weller, J. F., et al, *Applied Physics Letters,* 31(3), 146–148; Aug. 1977.

Smith, D. A., et al, *IEEE Transactions on Ultrasonics, Ferroelectrics and Frequency Control,* 40(1), 22–25, Jan. 1993.

Wang, X., "Acousto–Optic Tunable Filters Spectrally Modulate Light", *Laser Focus World,* May 1992.

Chatterjee, A., et. al, *IEEE Transactions on Sonics and Ultrasonics,* SU–32(5), 745–759, Sep. 1985.

Ricco, A. J., et al. *Appl. Phys. Lett.,* 50(21), 1474–1476, May 25, 1987.

Tsai, C. S. (Ed.), *Guided–Wave Acousto–Optics,* Springer–Verlag, 123–127, 1990.

Smith, H. I., *Acoustic Surface Waves,* Springer–Verlag, 305–324, 1978.

Chu, D. K. T., Ph.D., Dissertation, pp. 57–64.

ACOUSTIC FREQUENCY MIXING DEVICES USING POTASSIUM TITANYL PHOSPHATE AND ITS ANALOGS

This is a continuation of application Ser. No. 08,134,135, filed Oct. 8, 1993.

FIELD OF THE INVENTION

This invention relates to acoustic wave devices employing crystalline materials, and more particularly to acoustic wave devices which employ crystalline materials suitable for mixing the frequencies of at least two acoustic input signals.

BACKGROUND

Surface acoustic waves (i.e., "SAWs"), also known as Rayleigh waves, have been known since the middle of the nineteenth century. However, it was not until much later that the phenomenon of SAW propagation was first exploited for its applications to electronic devices. Acoustic wave devices known in the art commonly consist of a substrate on which a conductive material is deposited in a predetermined pattern. The patterned conductive material is known as an interdigital transducer (i.e., an IDT). R. M. White et al., Appl. Phys. Let., Volume 7, Number 12, pages.314–316 (Dec. 15, 1965), describes the use of the IDT as an efficient technique for the generation and detection of surface acoustic waves on a piezoelectric surface. An IDT may be suitably connected to an electrical input so that the refractive index in a crystal is changed as required by acoustic-optic applications. See, e.g., K. S. Buritskii et al., Soy. Tech Phys. Lett. 17(8) pp. 563–565 (1991) and L. Kuhn et al., Appl. Phys. Lett. 17(6) pp. 265–267(1970). In other applications, an IDT on one end of a substrate surface may be connected to a source of the frequency waves (e.g., television antenna —radio frequency) and an IDT on the other end of the substrate surface may be Connected to a device designed to receive a predetermined frequency (e.g., radio frequency for a specific television channel). The design of the IDT (i.e., the pattern of the conductive materials on the surface of a particular type of substrate) determines how the frequency will be controlled (e.g., which channel is received).

The types of acoustic waves which may be generated in a given crystal depend upon the piezoelectric-elastic-dielectric (i.e., PED) matrix of the crystal, which in turn depends on the crystal structure. In other words, not all materials are suitable for SAW generation, and materials which are suitable for SAW generation may not be suitable for generation of other types of acoustic waves. The properties of the substrate (e.g., the crystal structure) will determine the type of acoustic wave that will be generated, mechanism of the control and how high a frequency can be controlled.

Radio frequency control devices using substrates capable of controlling the received radio frequency by the generation of SAWs are known in the art For example, R. S. Wagers et al., IEEE Transactions on Sonics and Ultrasonics, Vol SU-31, No. 3, pages 168–174 (May 1984) discloses SAW devices based on lithium niobate. In these SAW devices the SAWs, generated by an IDT connected to a source of radio frequency waves, propagate through a y-cut lithium niobate crystal at a rate of about 3500 meters per second. This permits these SAW devices to be useful as radio frequency controllers in, for example, conventional television.

Acoustic waves, other than SAWs, may be generated in bulk crystal. For example, the Bleustein-Gulyaev wave (i.e., B-G wave) has been both mathematically postulated and experimentally proven to exist in crystals having 6 mm or mm 2 crystal symmetries, (see e.g., J. L. Bleustein, Appl. Phys. Lett., volume 13, Number 12, Pages 412–413 (Dec. 15, 1968), and C. -C. Tseng, Appl. Phys. Lett. Volume 16, Number 6, Pages 253–255 (Mar. 15, 1970)); and surface skimming bulk waves (i.e., SSBWs) have been shown to propagate on the surface of the crystal and to gradually propagate partially into the depths of the crystal. Such waves (both SSBWs and B-G waves) generally propagate faster than conventional surface acoustic waves. SSBWs have been generated in lithium tantalate and lithium niobate at a rate of about 4100 meters per second and about 5100 meters per second, respectively (see Meirion Lewis et al., 1977 Ultrasonics Symposium Proceedings IEEE Cat #77CH1264-1SU pages 744–752). B-G waves have been in $Bi_{12}GeO_{29}$ (i.e., "BGO") and $Ba2NaNb_5O_{15}$ (i.e., "BNN") to possess velocities of 1694 m/sec and 3627 m/sec, respectively (see C. -C. Tseng, Appl. Phys. Lett. Volume 16, Number 6, Pages 253–255 (Mar. 15, 1970)).

Since potassium titanyl phosphate (i.e., KTP) crystals are widely known to have a high nonlinear optical coefficients and resistance to optical damage, the SAW properties of rubidium exchanged KTP have been investigated relative to use in acousto-optic devices. K. S. Buritskii et al., Electronics Letters, Vol. 27, No. 21, pages 1896–1897 (Oct. 10, 1991), discusses the excitation of SAWs in Rb:KTP (i.e., a slab waveguide formed by Rb ion exchange on the surface of a single crystal of KTP). The velocity of the SAW generated in this waveguide was about 3900 meters per second. Buritskii et al., Sov. Tech. Phys. Lett., Volume 17, Number 8, pages 563–565 (August 1991) discusses the fabrication of a planar acousto-optic modulator using a Rb:KTP waveguide.

Acoustic frequency mixing devices involve a solid substrate to which at least two input signals are applied. In one type of device, convolvers, the input signals are applied using separate input IDTs in a manner which allows the acoustic waves to propagate towards each other and convolve to generate an output. In another type of device, correlators, the input signals are applied in a manner which allows the waves to propagate in the same direction and correlate to generate an output. Convolvers and correlators have various uses. In wireless communication such as cellular phones, for example, an important consideration is the reduction of crosstalk (interference); and one way to minimize the interference is to use nonlinear acoustic convolvers to code the signals so that interference is reduced. Radar system devices use correlators and convolvers to compare a signal under scrutiny with a local reference signal in the receiver.

The number of devices requiring frequency control has grown in number and complexity, and the demand for controlling higher frequencies, such as those needed for microwave generators and high definition television, has grown commensurately. The effectiveness of acoustic frequency mixing devices is also influenced by loss of power density in the device. For example, in wireless communications such as cellular phones, convolver effectiveness can be improved by increasing the nonlinearity and reducing signal losses. Similarly, devices in Radar systems such as convolvers and correlators could also be improved greatly if there were better nonliner acoustic materials or better ways to increase power density without the need to increase the total input power (J. H. Fischer, J. H. Cafarelta, D. R. Arsenault, G. T. Flynn, and C. A. Bouman, IEEE Proceedings, V 75, p 100–115, 1987). Acoustic waveguides therefore could be used to miniaturize the nonlinear SAW device to increase the power density without requiring higher power input.

Only a limited number of solid substrate materials have been identified as effective for use in acoustic frequency mixing devices. There is interest in identifying new effective materials for this application.

SUMMARY OF THE INVENTION

This invention provides acoustic frequency mixing devices for controlling high frequency signals by the generation of acoustic waves which comprise at least two input IDTs in combination with a crystalline substrate of $MTiOXO_4$, wherein M is selected from the group consisting of K, Rb, Tl, $NH_4$ and mixtures thereof and X is selected from the group-consisting of P, As, and mixtures thereof, wherein the crystalline substrate of $MTiOXO_4$ (e.g., KTP) has mm2 crystal symmetry.

More particularly, this invention provides acoustic frequency mixing devices for controlling high frequency signals by the generation of acoustic waves (e.g., SAWs having a velocity about 4000 m/sec on an untreated z-cut bulk crystalline $MTiOXO_4$ and B-G waves having a velocity of about 4100 meters per second on an untreated y-cut bulk crystalline $MTiOXO_4$) comprising (a) said crystalline substrate of $MTiOXO_4$, said substrate having a surface with at least two input areas; and (b) an input interdigital transducer deposited on each of at least two signal input areas of said substrate surface, each IDT suitable for connection to a source of electric signal and for inverse piezoelectrically generating acoustic waves (e.g., SAWs or B-G waves) in the substrate. For controlling high frequency electrical signals, the substrate surface has a output area and the device typically includes an output electrode (e.g., an interdigital transducer) deposited on the signal output area of said substrate surface suitable for piezoelectrically detecting acoustic waves obtained by mixing the frequency of waves generated by at least two input ITDs, and for connecting the output electrode to an electric signal responsive device.

Where said crystalline substrate of $MTiOXO_4$ is used for SAW generation, said input IDTs should be deposited on the signal input areas such that SAWs are generated in the x or y direction in said substrate; and where the crystalline substrate of $MTiOXO_4$ is used for B-G wave generation said input IDTs should be deposited on the signal input areas such that B-G waves are generated in the z direction. Acoustic waveguides may optionally be used in conjunction with devices employing SAW generation.

DETAILED DESCRIPTION

Figure 1:
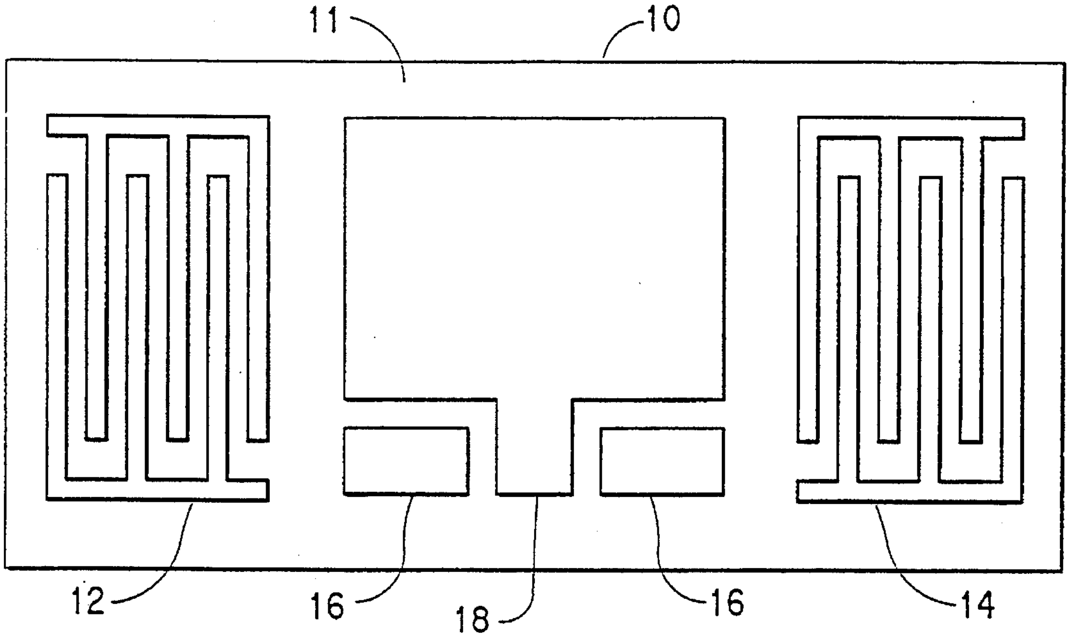
FIG. 1 is aschematic drawing of an acoustic frequency mixing device in accordance with the invention.

In accordance with this invention crystals of the formula $MTiOXO_4$ (where M is selected from the group consisting of K, Rb, Tl, $NH_4$ and mixtures thereof and X is selected from the group consisting of P, As, and mixtures thereof) have been determined as suitable for use as acoustic frequency mixing substrates. This was determined as follows.

A sample of x-cut KTP and a sample of y-cut KTP were used for examination of the effect of an electric field on piezoelectric resonance (this effect indicated how good the material is for nonlinear acoustic applications such as acoustic convolvers). The y-cut KTP was prepared by polishing it on both y faces and then coating both y faces with gold thin films to make a bulk piezoelectric resonantor. Similarly, the x-cut KTP was prepared by polishing it on both x faces and then coating both x faces with gold thin films to make a bulk piezoelectric resonantor. The variation in the piezoelectric resonance as a function of the externally applied electric voltage was measured for both samples. From the data on resonance variation versus applied electric field strength, the sensitivity of the x-cut KTP and y-cut KTP to the external electric field was determined. Data from the measurements are included below in Table I and Table II. These experimental results indicated that both y-cut KTP and x-cut KTP had suitable sensitivity for nonlinear acoustic mixing applications. Other crystalline materials of the formula $MTiOXO_4$ are also considered suitable for nonlinear acoustic mixing applications because of their common crystalline structure with KTP.

TABLE I

X-Cut Flux Grown KTP Crystal (1.769 mm Thick)

| Voltage (V) | Field (V/mm) | Resonance (Hz) | Normalized Frequency Variation |
|---|---|---|---|
| 0.0000 | 0.0000 | 1174031.0 | 0.0000 |
| 10.000 | 5659.3 | 1174147.0 | 9.88053-05 |
| 20.000 | 11319 | 1174217.0 | 0.00015843 |
| 30.000 | 16978 | 1174252.0 | 0.00018824 |
| 40.000 | 22637 | 1174287.0 | 0.00021805 |
| 50.000 | 28297 | 1174299.0 | 0.00022827 |
| 60.000 | 33956 | 1174310.0 | 0.00023764 |
| 70.000 | 39615 | 1174322.0 | 0.00024786 |
| 80.000 | 45274 | 1174333.0 | 0.00025723 |
| 90.000 | 50934 | 1174333.0 | 0.00025723 |
| 100.000 | 56593 | 1174333.0 | 0.00025723 |

Using the first four points (from 0 to 30 volts) the nonlinearity of the KTP sample was estimated as about $2.77\times10^{-10}\ V^{-1}$.

TABLE II

Y-Cut Flax Grown KTP Crystal (1.833 mm Thick)

| Voltage (V) | Resonance (V/mm) | Field (Hz) | Normalized Frequency Variation |
|---|---|---|---|
| 0.0000 | 1161129.0 | 0.0000 | 0.0000 |
| 10.000 | 1161181.0 | 5455.5 | 4.4784e-05 |

TABLE II-continued

Y-Cut Flax Grown KTP Crystal (1.833 mm Thick)

| Voltage (V) | Resonance (V/mm) | Field (Hz) | Normalized Frequency Variation |
|---|---|---|---|
| 20.000 | 1161198.0 | 10911 | 5.9425e-05 |
| 30.000 | 1161208.0 | 16367 | 6.8037e-05 |
| 40.000 | 1161214.0 | 21822 | 7.3205e-05 |
| 50.000 | 1161220.0 | 27278 | 7.8372e-05 |
| 60.000 | 1161225.0 | 32733 | 8.2678e-05 |
| 70.000 | 1161230.0 | 38189 | 8.6984e-05 |
| 80.000 | 1161230.0 | 43644 | 8.6984e-05 |
| 90.000 | 1161230.0 | 49100 | 8.6984e-05 |
| 100.000 | 1161230.0 | 54555 | 8.6984e-05 |

Using the first four points (0 to 30 volts) the nonlinearity of the KTP sample was estimated as about $4\times10^{-9}$ $V^{-1}$.

A crystalline substrate of $MTiOXO_4$ (where M is K, Rb, Tl and/or $NH_4$, and X is P and/or As) suitable for use in the practice of this invention may be prepared in the mm2 crystal symmetry by a variety of methods well known in the art. Two fundamental methods are commonly used; one, known as the hydrothermal method (see, e.g., U.S. Pat. No. 5,066,356) and the other, known as the flux method (see, e.g., U.S. Pat. No. 4,231,838). Of the many $MTiOXO_4$ analogues, $KTiOPO_4$ is preferred. The crystalline substrate can be in the form of a single crystal or crystalline thin film, so long as the crystal symmetry is mm2. In use the crystalline substrate can be cut along the x-, y- or z-axis. All rotated cuts will work for the generation of SAW or SSBAW except x- and y-principle cut, but crystals cut along the x- or y-axis are used for the generation of Bleustein-Gulyaev waves. Bulk crystalline substrates at $MTiOXO_4$ such as KTP may be used for generating acoustic waves having a wavelength equal to that of the period of IDT used for acoustic wave generation.

The types of waves generated in the crystalline substrate are fundamentally determined by crystal structure. The SAW generated in the crystalline substrates travel through the substrate at rates of about 3600 meters per second; SSBAW, 6000 meters per second; and bulk acoustic waves, 7800 meters per second. An application of this invention lies in the generation of SAW and B-G waves in bulk crystals, which can only be generated in certain crystal structures (e.g., mm2 crystal symmetry common to z-cut $MTiOXO_4$). SAW can be generated directly on a z-cut $MTiOXO_4$ substrate without any ionic dopants such as rubidium. B-G waves can also be generated on x or y cut substrate with propagation along z axis. There are several advantages of using $MTiOXO_4$ for generating B-G waves. First, since they are bulk acoustic waves, the bulk coupling coefficient (which is a material index of how efficient the material can convert the electrical energy into acoustic energy) of B-G waves can be very high (roughly about 20%, or about forty times the surface coupling coefficient of quartz), see D. K. T. Chu, Ph.D. dissertation, pages 57–64, Department of Electrical Engineering, University of Delaware (1991). Also as reported in this dissertation, the velocity is very high (reportedly about 4100 m/sec). A further application of this invention lies in the use of crystals having alternating domains, because, within a given IDT design, the frequency of the fundamental acoustic wave is doubled and can thus be made sufficiently high to allow for control of microwave frequencies, such as those used in high definition television and radar.

Interdigital transducers can be deposited on the surface of the crystalline substrate by conventional lithographic techniques, such as those described by H. I. Smith, Acoustic Surface Waves, Fabrication Techniques for Surface Wave Devices, Pages 305–324, Springer-Verlag, Berlin Heidelberg, N.Y. (1978). To develop the desired pattern onto $MTiOXO_4$ substrate one may use the following steps: (1) prepare the $MTiOXO_4$ substrate (usually z-cut for SAWs or x- or y-cut for B-G waves); (2) polish the substrate to provide a flatness better than half wavelength (typically about 0.3 μm flatness variation); (3) evaporate a conductive material, typically a metal film such as titanium about 1000 Å thick, onto the crystalline substrate using an electron beam evaporator; (4) spin a positive photoresist (e.g., a photopolymer) onto the substrate and softbake (prebake) at a suitable temperature and time period for the photoresist used; (5) align a predesigned photomask and expose it to light for a time sufficient to develop the desired resolution; (6) hardbake (postbake) for a suitable time and temperature for the photoresist used; (7) develop the exposed photoresist using a suitable developer; (8) etch the titanium off the area which has no photoresist cover; and (9) strip off unexposed photoresist using specified stripper (e.g., acetone). After all these processing steps, one can use a commercially available network analyzer such as Hewlett-Packard 8753C to analyze the performance of the devices. The pattern chosen for the IDT determines how the frequency is controlled. The operating frequency of an acoustic wave device is determined by the following equation:

$$f=v/\lambda$$

where v is the velocity of the acoustic wave generated in the device by the IDT and λ is the wavelength of the acoustic wave generated in the device by the IDT. Conventionally, the wavelength of the acoustic wave is determined by the IDT pattern. The smaller the width of the IDT "finger" in the direction of wave propagation, the smaller the wavelength of the acoustic wave generated in the device by the IDT, or the higher the operating frequency. However, there is a practical limit as to how small one can make the width of the IDT fingers due to the diffraction-free limit of the exposing sources such as UV light, electronic beam or X-ray. Consequently, a feature of this invention lies in the discovery that the use of a domain reversed crystalline material combined with proper application of IDTs can effectively double the acoustic wave frequency for a given "finger" width of IDT without having to reduce the periodicity of IDT in half as the conventional technique required. This is discussed further herein below in reference to the drawings.

The device of this invention using a substrate described herein, in combination with at least two input IDTs, may be used to Control high frequency optic waves by generating acoustic waves in the substrate while the substrate is optically employed (e.g., while laser-generated waves are passed through the substrate for wavelength conversion). For such use, the device may further comprise a source of laser waves (e.g., a laser). Alternatively, an output IDT may be used to detect the acoustic waves generated in the substrate for the purpose of controlling high frequency electric waves. Each IDT used at the input areas of the substrate surface and, as applicable, the output electrode are suitable for connection to an electric signal source and an electric signal responsive device, respectively. The devices for controlling high frequency signals of this invention may, optionally include connectors to facilitate connection of the device to an electric signal source and/or an electric signal responsive device.

The connections used between the interdigital transducers and either the high frequency signal or the signal responsive device are typically conventional conductive materials such as metal wires. For research purposes, a microwave probe head (Cascade Microtech SN17307, Cascade Microtech Inc., PO Box 1589, Beaverton, Oreg. 97057–1589) can be used instead of wires to receive electrical signals generated from a network analyzer and then input the signals to the first IDT to excite acoustic waves; and another probe head can be used on the signal end of the substrate surface to direct acoustic waves to receive the output to the network analyzer to analyze the transmission properties of the device.

The present invention includes a convolver comprising a crystalline substrate of $MTiOXO_4$ having a surface with a signal input area, a coding source input area, and an output area located between the signal input area and the .coding source input area, an input IDT on the signal input area, an input IDT on the coding source input area, and an output electrode (e.g., a metallic interaction pad) on the output area to collect convolved signals generated by mixing the frequencies from the input signal from the input IDT on the signal input area and the coding source from the input IDT on the coding source input area. A device using bulk crystalline $MTiOXO_4$ as a nonlinear acoustic device such as convolver is skown as (10) in FIG. 1. The device (10) comprises a crystalline surface (11) having a deposited thereon an IDT for providing a signal source (12) and an IDT for providing a coding source (14); groundings (16) for the device; and an electrode (18) for detecting the interaction between acoustic waves generated by the two IDTs (12) and (14).

The present invention also includes a correlator comprising a crystalline substrate of $MTiOXO_4$ having a surface with a first signal input area, a second signal input area, and an output area (said second signal input area located between the first signal input area and the output area), an input IDT on the first signal input area, an input IDT on the second signal input area, and an output electrode (e.g., a metallic interaction pad) on the output area to collect the correlated signals generated by mixing the frequencies from the first signal input area (from the IDT thereon) and from the second signal input area (from the IDT thereon).

One of the applications in nonlinear acoustic devices is the acoustic convolver in radar systems. Similar devices can apply to commercial mobile phones to prevent crosstalk interference. However, these applications require high acoustic power density (defined as the total acoustic power divided by the interaction area) to proceed the nonlinear acoustic convolutions. One way to increase the power density for surface acoustic wave devices without having to use higher power supply is to use an acoustic channel waveguide structure to focus the acoustic signals into a channel. High power density can thus be achieved. This unique acoustic energy confinement ability allows production of convolvers having low energy consumption (high efficiency). These may be used, for example, for security coding in mobile phones, radar systems, and wireless communications.

Figure 2:
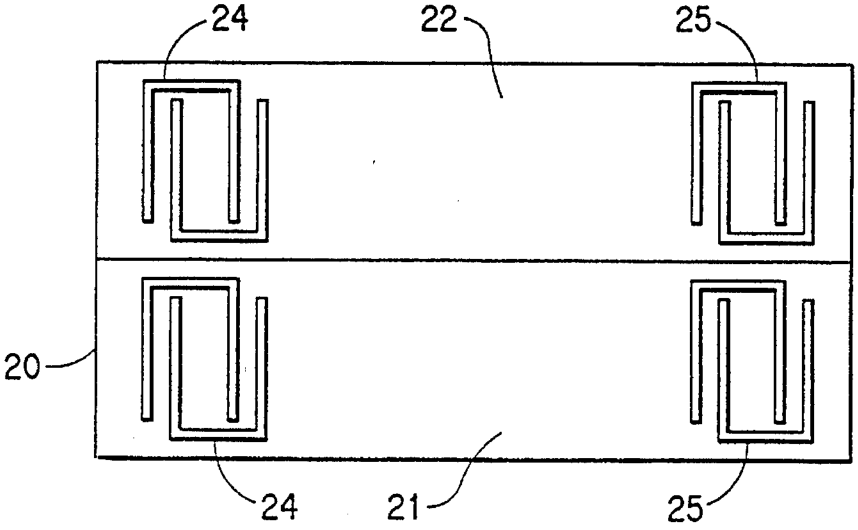
FIG. 2 is a schematic drawing of a surface acoustic wave mixing device illustrating acoustic waveguiding in an ion exchanged surface adjacent to unmodified surface of bulk crystalline $MTiOXO_4$.

Continuous channel waveguides for surface acoustic waves may be provided in accordance with this invention to confine source acoustic waves. Generally, these waveguides have a composition different from the composition of the substrate material and physical properties sufficiently different from the physical properties of the substrate material to substantially confine surface acoustic waves in the channel waveguide (e.g., a higher mass density, higher optical refractive index, slower acoustic velocity and/or larger electromagnetic coupling coefficient). Acoustic waveguide channels for surface acoustic waves can be a provided in the crystalline substrate by a variety of methods well known in the art, such as the ion exchange method described in U.S. Pat. No. 4,766,954, which is hereby incorporated by reference. Acoustic waveguiding is illustrated in FIG. 2. FIG. 2 represents the surface of the crystalline $MTiOXO_4$ substrate (20) where one portion of the surface (21) is original substrate material and another portion of the surface (22) has been ion-exchanged to change its composition. Each portion (21) and (22) has an input (i.e., generating) IDT (24) and an output (i.e., receiving) IDT (25). Upon providing equivalent signals through the input IDTs (24) in both the bulk crystalline portion (21), and the ion-exchanged crystalline portion (22), the velocity of surface acoustic waves in the ion-exchanged region is found by monitoring the output from the respective output IDTs (25) to be different velocity from the surface acoustic waves generated in the bulk crystalline region. This illustrates that the ion-exchanged region is capable of acting as an acoustic waveguide.

Figure 3:
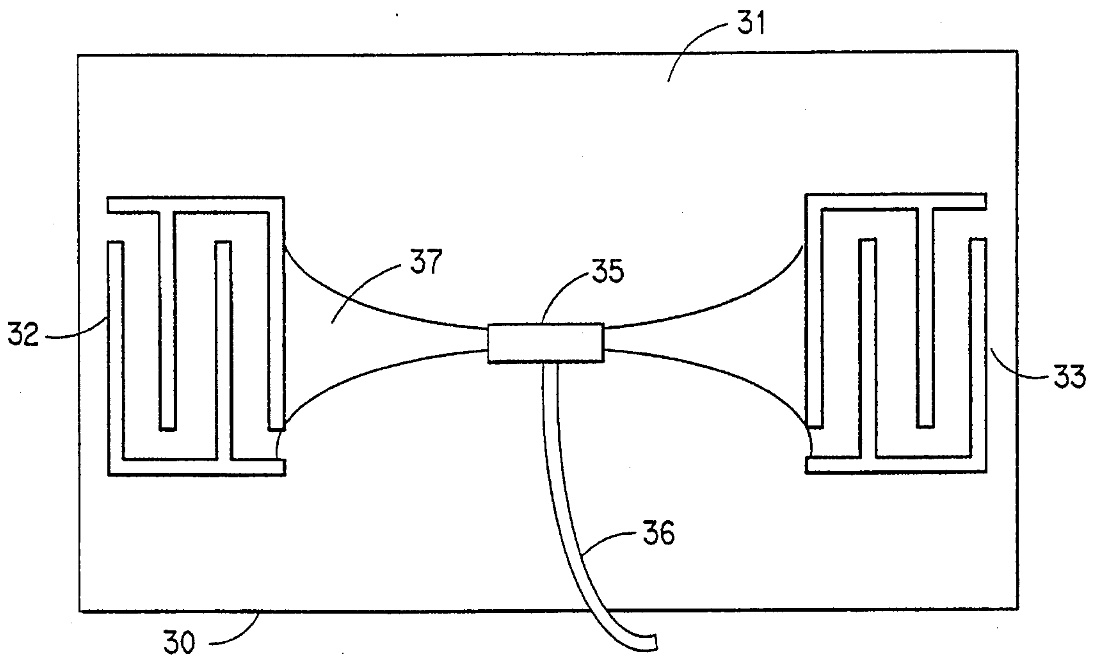
FIG. 3 is a schematic drawing of an embodiment of a surface acoustic wave mixing device using acoustic waveguiding.
Figure 4:
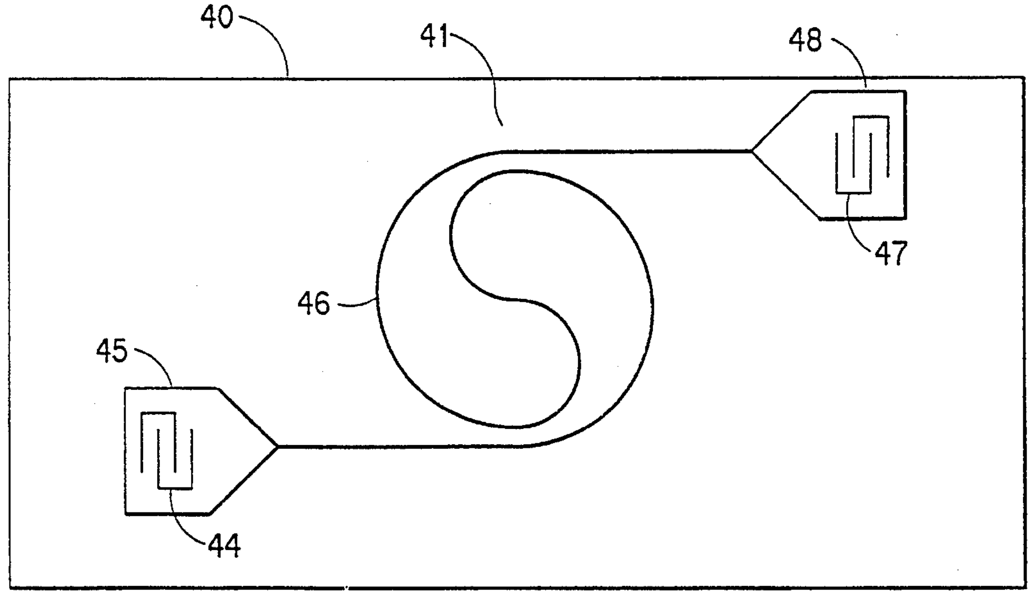
FIG. 4 is a schematic drawing of a surface acoustic wave mixing device using acoustic waveguiding.
Figure 5:
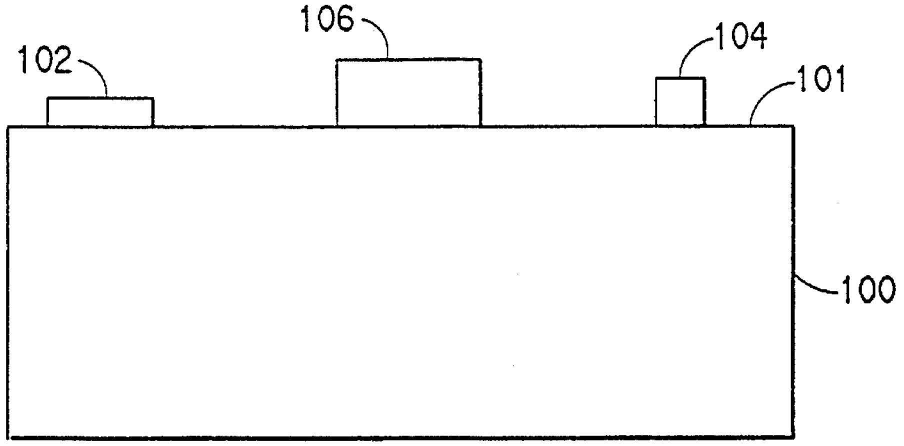
FIG. 5 schematically illustrates a substrate for use in correlation (100) having a surface (101) with first signal input IDT (102), an output electrode (104) and a second signal input IDT (106) respectively mounted on a first signal input area, an output area and a second signal input area.
Figure 6:
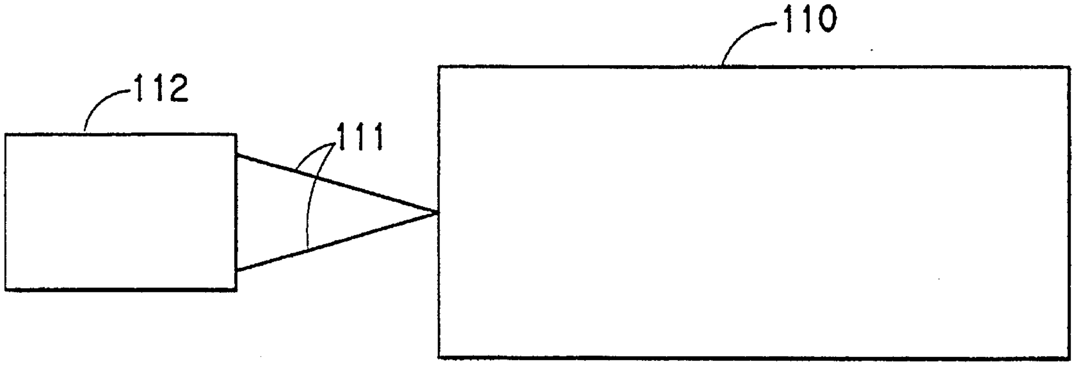
FIG. 6 schematically illustrates the use of a laser (112) as a source of high frequency optic waves (111) to a substrate having an input IDT deposited thereon (110).

This invention provides acoustic wave mixing devices for surface acoustic waves which have a substrate of crystalline $MTiOXO_4$ and acoustic waveguide channels of ion exchanged $MTiOXO_4$ having higher mass density than the substrate material. FIGS. 3 and 4, further described below respectively, illustrate devices in accordance with this invention utilizing an ion-exchange process to (i) focus the surface acoustic signals into smaller interactive region and (ii) to increase the interaction length where frequency mixing takes place. Further discussion of acoustic waveguides is provided in U.S. patent application Ser. No. 08/134,232. One device in accordance with this invention comprises (a) a KTP substrate having a channel waveguide (which may or may not be a straight line) formed therein by ion exchange (e.g., with Tl, Rb or Cs); (b) an input signal IDT on one end of the channel waveguide; (c) a coding signal IDT on the other end of the channel waveguide; (d) an output electrode on top of the ion-exchanged waveguide (conforming in shape to the waveguide) between said IDT's (coding IDT and signal IDT); and (e) connecting wire for each of said IDTs and the output electrode. Converging regions may be provided at each end of the waveguide to compress the surface acoustic waves.

In accordance with this invention one can implement the waveguide technique in surface acoustic frequency mixing devices so that the devices can be improved further. Such a device is illustrated as (30) in FIG. 3. FIG. 3 represents a nonlinear acoustic convolver integrated with ion-exchanged crystalline acoustic waveguide. The surface acoustic waves may be focused into a small area in order to obtain a large acoustic intensity. This device includes a surface of crystalline $MTiOXO_4$ substrate (31) having deposited thereon for a signal source IDT (32) for generating signal acoustic waves, a coding source IDT (33) for generating coding acoustic waves, and detecting electrode (35) attached to an output connection (36). An ion-exchanged waveguide region (37) is provided on the surface of crystalline substrate (31) between signal IDT (32) and detector (35) and an ion-exchanged waveguide region is also provided between coding IDT (33) and detector (35).

It is often preferred to have as long of a interaction path for the two surface acoustic waves as possible to increase the data processing capability of an acoustic convolver. Therefore, it is possible in accordance with this invention to configure a device so that the interaction (convolution) path of the surface acoustic waves is elongated. This is illustrated in FIG. 4, which represents a device (40) with a crystalline $MTiOXO_4$ substrate surface (41) having ion-exchanged regions with focusing and guiding capability integrated into a bulk device. The device comprises an IDT for the signal source (44) on an ion exchanged region (45) for producing surface acoustic waves to be guided through ion exchanged region (46) of the crystal; an IDT for the coding source (47) on an ion exchanged region (48) of the crystal for producing surface acoustic waves to be guided through ion exchanged region (46); and deposited on top of the guiding region (46), a metallic film (not shown) with the same width as guiding region (46) to act as the detecting electrode. It is clear that one could increase the interaction path if necessary by intertwining the curve having acoustic waveguide characteristics.

What is claimed is:

1. An acoustic frequency mixing device for controlling high frequency signals by the generation of acoustic waves, comprising:

(a) a crystalline substrate of $MTiOXO_4$, wherein M is selected from the group consisting of K, Rb, Tl and $NH_4$ and mixtures thereof and X is selected from the group consisting of P and As and mixtures thereof, wherein the crystalline substrate of $MTiOXO_4$ has mm2 crystal symmetry, acoustic nonlinearity, and a surface with an output area and at least two input areas;

(b) an input interdigital transducer deposited on each of at least two input areas of said substrate surface, each IDT suitable for connection to a source of electric signal and for inverse piezoelectrically generating acoustic waves in the crystalline substrate; and (c) an output electrode deposited on the output area of said substrate surface, suitable for piezoelectrically detecting acoustic waves obtained by mixing the frequency of waves generated by at least two of said input interdigital transducers and for connection to an electric signal responsive device.

2. A device in accordance with claim 1 for use as a convolver comprising a substrate having a surface with signal input area, a coding source input area and an output area located between the signal input area and the coding source input area; an input IDT on the signal input area; an input IDT on the coding source input area; and an output electrode on the output area to collect convolved signals generated by mixing the frequency from the input signal from the input IDT on the signal input area and the coding source from the input IDT on the coding source input area.

3. A device in accordance with claim 1 for use as a correlator comprising a substrate having a surface with a first signal input area, an output area and a second signal input area located between the first signal input area and the output area; an input IDT on the first signal input area; an input IDT on the second signal input area; an output electrode on the output area to collect correlated signals generated by mixing the frequencies from the first signal input area for the IDT thereon and for the second signal input area for the IDT thereon.

4. A device in accordance with claim 1 wherein the substrate is bulk $KTiOPO_4$.

5. A device in accordance with claim 1, claim 2, claim 3, or claim 4 for controlling high frequency signals by the generation of surface acoustic waves wherein the bulk crystalline substrate is a z-cut bulk crystalline substrate.

6. A device in accordance with claim 1, claim 2, claim 3, or claim 4 for controlling high frequency signals by the generation of Bleustein-Gulyaev waves wherein the bulk crystalline substrate is an x-cut or y-cut bulk crystalline substrate.

7. A device in accordance with claim 1 for controlling high frequency optic signals wherein said device further comprises a laser to generate optic waves which are passed through the substrate.

8. A device in accordance with claim 1 for controlling high frequency electric signals wherein said substrate surface has an output area, and wherein said device further comprises an output electrode deposited on the output area of said substrate surface suitable for piezoelectrically detecting said acoustic waves obtained by mixing the frequencies of waves generated by at least two input interdigital transducers, and for connection to an electric signal responsive device.

9. A device in accordance with claim 1 for controlling high frequency signals by the generation of surface acoustic waves, having an acoustic waveguide channel of ion-exchanged $MTiOXO_4$ with higher mass density than the substrate material to confine surface acoustic waves.

10. A device in accordance with claim 1 for use as a convolver comprising a signal input area, a coding source input area and an output area located between the signal input area and the coding source input area;

an input IDT on the signal input area;

an input IDT on the coding source input area; and an output electrode on the output area to collect convolved signals generated by mixing the frequencies of the input signal from the input IDT on the signal input area and the coding source from the input IDT on the coding source input area.

* * * * *